United States Patent
Takano

(10) Patent No.: US 6,502,211 B1
(45) Date of Patent: Dec. 31, 2002

(54) SEMICONDUCTOR MEMORY TESTING APPARATUS

(75) Inventor: Katsuhiko Takano, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/354,551

(22) Filed: Jul. 15, 1999

(30) Foreign Application Priority Data

Jul. 15, 1998 (JP) .......................................... 10-200619

(51) Int. Cl.[7] .................................................. H02H 3/05
(52) U.S. Cl. ........................................ 714/42; 714/718
(58) Field of Search ............................. 714/42, 53, 54, 714/718, 733, 734; 365/201

(56) References Cited

U.S. PATENT DOCUMENTS 5,790,559 A * 8/1998 Sato ........................... 714/720
5,909,448 A * 6/1999 Takahashi .................... 365/201
6,115,833 A * 9/2000 Sato et al. .................... 714/718

* cited by examiner

*Primary Examiner*—Dieu-Minh Le
(74) *Attorney, Agent, or Firm*—David N. Lathrop, Esq.; Gallagher & Lathrop

(57) ABSTRACT

The storage capacity of a failure analysis memory that performs an interleaved operation is reduced. There are provided a lower order address selecting part for selecting and extracting at least the least significant bit of an address signal, a bank control part for generating a bank switching signal by a logical signal outputted from the lower order address selecting part, a plurality of flip-flops for selecting either one of a plurality of banks operating in the interleaved operation by the bank switching signal outputted from the bank control part, and an access means for accessing an address of a memory constituting the selected bank by an address signal composed of the remaining higher order bit or bits of the address signal.

12 Claims, 9 Drawing Sheets

FIG.3
TRUTH TABLE OF BANK CONTROL
| LADR | LD1 | LD2 |
|------|-----|-----|
| 0    | 1   | 0   |
| 1    | 0   | 1   |
FIG.4 A
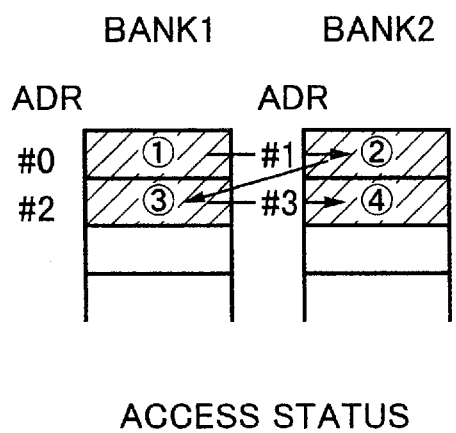
ACCESS STATUS
FIG.4 B
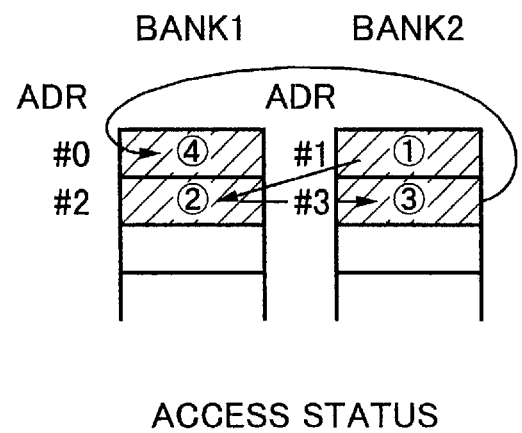
ACCESS STATUS

| ADR | B6 | B5 | B4 | B3 | B2 | B1 |
|---|---|---|---|---|---|---|
| #0 | 0 | 0 | 0 | 0 | 0 | 0 |
| #1 | 0 | 0 | 0 | 0 | 0 | 1 |
| #2 | 0 | 0 | 0 | 0 | 1 | 0 |
| #3 | 0 | 0 | 0 | 0 | 1 | 1 |
| #4 | 0 | 0 | 0 | 1 | 0 | 0 |
| #5 | 0 | 0 | 0 | 1 | 0 | 1 |
| #6 | 0 | 0 | 0 | 1 | 1 | 0 |
| #7 | 0 | 0 | 0 | 1 | 1 | 1 |

FIG.5

RELATIONSHIP BETWEEN NUMBER OF INTERLEAVE AND NUMBER OF BANKS

| OPERATING FREQUENCY OF MUT : f | INTERLEAVE | NUMBER OF BANKS |
|---|---|---|
| $f < F$ | 1 WAY | 1 |
| $F < f \leq 2F$ | 2 WAY | 2 |
| $2F < f \leq 3F$ | 3 WAY | 3 |
| $\vdots$ | $\vdots$ | $\vdots$ |
| $(n-1)F < f \leq nF$ | n WAY | n |

F : OPERABLE FREQUENCY OF FAM

FIG.12

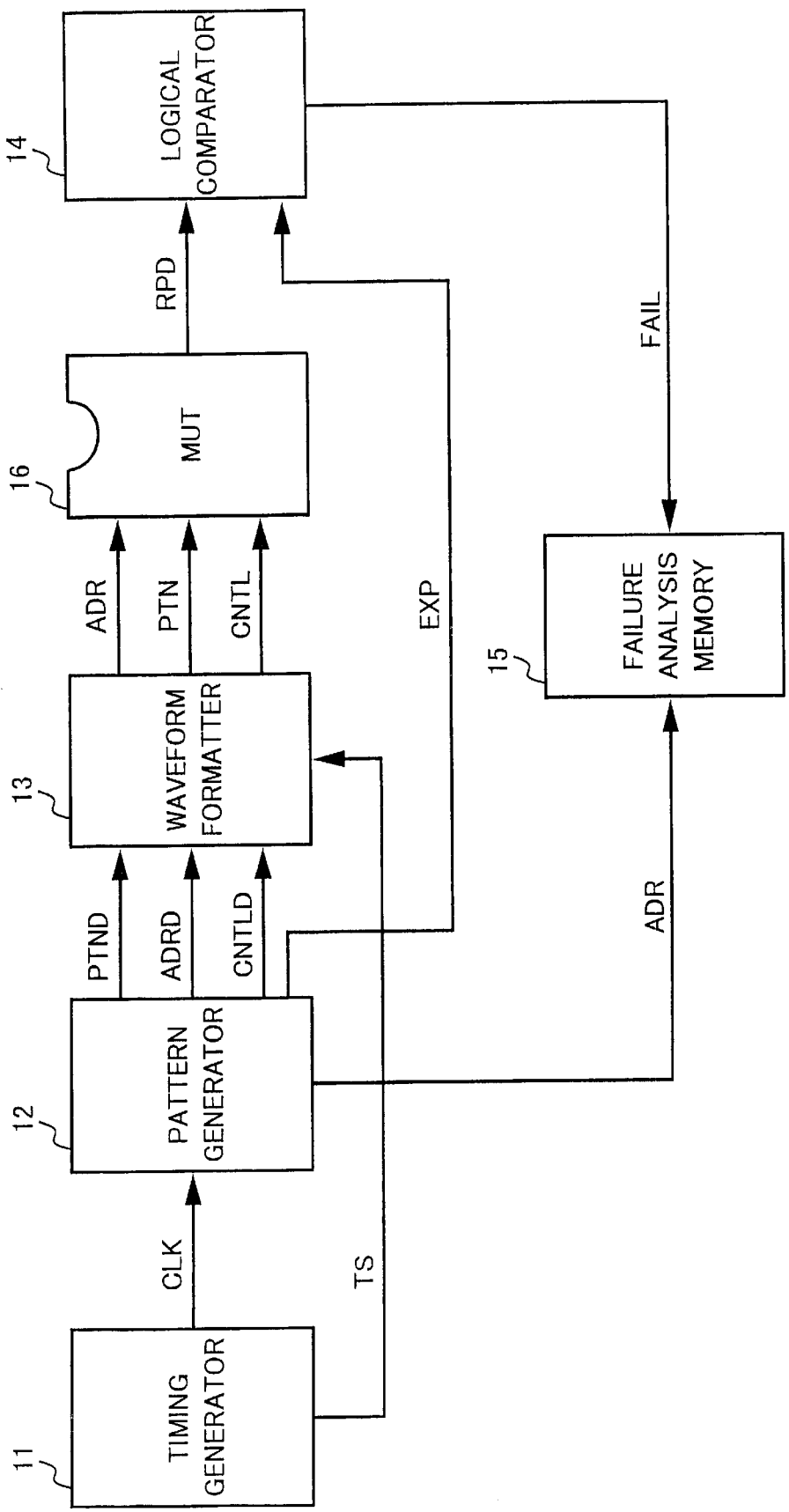

FIG.10
BURST ADDRESS FOR EACH SEQUENCE
| SEQUENCE / START ADDRESS | INTERLEAVE | LINEAR |
|---|---|---|
| #0 | #0–#1–#2–#3 | #0–#1–#2–#3 |
| #1 | #1–#0–#3–#2 | #1–#2–#3–#0 |
| #2 | #2–#3–#0–#1 | #2–#3–#0–#1 |
| #3 | #3–#2–#1–#0 | #3–#0–#1–#2 |
$A_1$  $A_2$  $A_3$  $A_4$
FIG.11 A
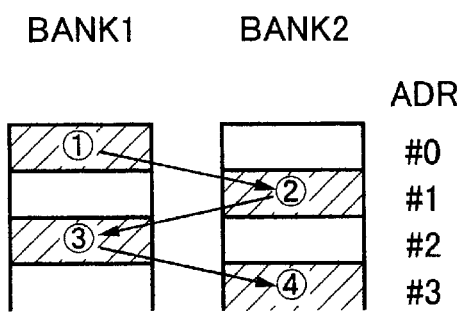
CASE : #0–#1–#2–#3
ACCESS STATUS
FIG.11 B
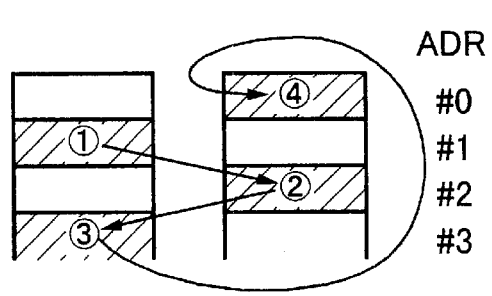
CASE : #1–#2–#3–#0
ACCESS STATUS

SEMICONDUCTOR MEMORY TESTING APPARATUS

BACKGROUND OF THE INVENTION

1. Field of the Invention

The present invention relates to a memory testing apparatus that is suitable for testing a semiconductor memory such as a memory constructed by a semiconductor integrated circuit (semiconductor integrated circuit memory; hereinafter referred to as IC memory), and more particularly, to a failure analysis memory for storing therein the test result of a semiconductor memory.

2. Description of the Related Art

FIG. 6 shows a basic configuration of the conventional semiconductor memory testing apparatus of such type. The illustrated semiconductor memory testing apparatus comprises a timing generator 11, a pattern generator 12, a waveform formatter 13, a logical comparator 14, and a failure analysis memory (FAM) 15.

The timing generator 11 generates, in order to control the test timing of the entire testing apparatus, a reference clock CLK and various kinds of timing signals (pulses) TS. Although a timing signal TS is applied only to the waveform formatter 13 in FIG. 6, it is needless to say that the timing signals are also applied to other units (apparatus, devices and circuits) of the testing apparatus including the logical comparator 14.

The pattern generator 12 generates, in synchronism with the reference clock CLK supplied from the timing generator 11, address data ADRD, test pattern data PTND, and control data CNTLD all of which are to be supplied to a semiconductor memory under test (hereinafter referred to as MUT) 16. These data signals are supplied to the waveform formatter 13. The waveform formatter 13 converts the inputted data signals, by the timing signals TS supplied from the timing generator 11, into an address signal ADR, a test pattern signal PTN and a control signal CNTL, respectively, each having a real waveform required for testing. These signals are applied to the MUT 16.

The write operation and the read-out operation of the MUT 16 are controlled by the control signal CNTL supplied thereto through the waveform formatter 13, so that a write operation of the test pattern signal PTN applied to the MUT 16 from the waveform formatter 13 and a read-out operation of the written test pattern signal from the MUT 16 can be carried out. The test pattern signal PTN having been written in the MUT 16 is read out therefrom later on, and the read-out response signal RPD is supplied to the logical comparator 14 where the response signal RPD is compared with an expected value signal EXP supplied from the pattern generator 12 to detect whether there is any anticoincidence between both two signals or not, and a decision is rendered that the MUT 16 is defective (failure) or not defective (pass).

The logical comparator 14 determines, when there is any anticoincidence between the two signals, that the memory cell of the MUT 16 at an address thereof from which the response signal RPD has been read out is defective, and generates a failure signal (data) FAIL indicating that fact. Usually, this failure signal FAIL is expressed by a logical "1" signal, and is stored in a memory cell of the failure analysis memory 15 specified by the address signal ADR supplied from the pattern generator 12. In general, the failure signal (data) is stored in the same address of the failure analysis memory 15 as that of the failure memory cell of the MUT 16.

On the contrary, when the response signal RPD coincides with the expected value signal EXP, the logical comparator 14 determines that the memory cell of the MUT 16 at an address thereof from which the response signal has been read out is defectless or normal, and generates a pass signal indicating that fact. This pass signal is expressed by a logical "0" signal, and is usually not stored in the failure analysis memory 15.

After the testing has been completed, a failure analysis for the MUT 16 is carried out with reference to the failure signals FAIL stored in the failure analysis memory 15. For example, in the case that the failure signals are utilized in carrying out a failure relief of the MUT, a failure map is created based on the read-out failure signals, and a decision is rendered as to whether the relief of the failure memory cells of the MUT 16 can be done or not.

FIG. 7 shows in outline a configuration of the failure analysis memory 15. The failure analysis memory 15 comprises a memory part 15A for storing therein a failure signal FAIL, and a control part 15B for controlling the memory part 15A such that the memory part 15A has the same data bit width (the number of bits) and the same word depth as those of the MUT 16. The control part 15B comprises an address formatting part 15B-1 to which an address signal ADR is inputted from the pattern generator 12, and a memory control part 15B-2 to which a failure signal FAIL is inputted from the logical comparator 14. Further, although not shown, to a data input terminal of the memory part 15A is supplied a failure signal FAIL from the logical comparator 14.

The address formatting part 15B-1 formats an address signal ADR supplied from the pattern generator 12, in accordance with the word structure of the MUT 16, into a higher order address signal (the most significant bit or several higher order bits including the most significant bit of the address signal ADR) MADR and a lower order address signal (the least significant bit or several lower order bits including the least significant bit od the address signal ADR) LADR separated from each other. The higher order address signal MADR is supplied to the memory control part 15B-2 as a signal for controlling an enable signal for a RAM (Random Access Memory) constituting the memory part 15A, thereby to control the connection of the memory part 15A in the direction of the word depth. The memory control part 15B-2 generates, based on the failure signal FAIL supplied from the logical comparator 14 and the higher order address signal MADR supplied from the address formatting part 15B-1, a write control signal WRSG, and supplies it to the memory part 15A.

The lower order address signal LADR is supplied to the memory part 15A as an address signal for accessing the memory part 15A. Accordingly, the addresses of the memory part 15A are accessed by lower order address signals LADR each supplied from the address formatting part 15B-1.

When both of the lower order address signal LADR supplied from the address formatting part 15B-1 and the failure signal FAIL supplied from the logical comparator 14 are logical "1s", the write control signal WRSG outputted from the memory control part 15B-2 becomes effective or valid (logical "1"). As a result, the failure analysis memory 15 writes a logical "1" (corresponding to the generated failure signal FAIL) being applied to the data input terminal of the memory part 15A in the same address of the memory part 15A as that of the MUT 16. After the testing has been completed, the stored contents of the memory part 15A are read out therefrom, and the analysis of the failure memory cells (addresses) of the MUT 16 is performed. An address of the failure analysis memory 15 from which a logical "1" is read out corresponds to an address of the memory cell of the MUT 16 at which a failure has occurred.

Incidentally, in recent years, a demand for semiconductor memories that can operate at high rate or speed have been increased more and more, and some high-rate operating memories are already in practical use. One of the high-rate operating semiconductor memories includes a memory that operates in burst mode. Burst mode means, in this specification and claims, a mode in which, on the basis of an address signal supplied to a memory, the lower order address bit or bits of this address signal are changed to an address bit or bits (burst address) automatically generated within the memory which is, in turn, accessed by this address bit or bits. By high-rate generation of the burst address in the memory (by generating the burst address at high rate or speed), the write operation in and the read-out operation of the memory at high rate can be realized.

In order to test such a high-speed memory, it is required that failure signals generated at high rate must be stored in the failure analysis memory 15 of the memory testing apparatus. For this reason, the failure analysis memory 15 is constructed such that the memory part 15A thereof stores failure signals generated at high rate by its interleaved operation so as to store these high-rate failure signals therein. The interleaved operation means, in this specification and claims, an operating system in which there are provided a plurality of memory blocks each of which is constituted by a plurality of memories corresponding to the bit width of a memory under test, each memory usually having the same storage capacity as that of the memory under test, and the plurality of memory blocks are sequentially operated at timings of their operations shifted from one another to write signals therein. The number of memory blocks to be prepared is referred to as the number of ways of interleave. If the number of memory blocks is two, it is called a two-way interleaved operation. If the number of memory blocks is four, it is called a four-way interleaved operation. Since each memory block is also called a bank, the word "bank" will be used hereinafter.

FIG. 8 shows an example of configuration of the failure analysis memory 15 for performing a two-way interleaved operation. Since the failure analysis memory 15 operates in the two-way interleaved operation, the memory part 15A is constituted by a first and a second two banks BANK1 and BANK2.

There are provided a first flip-flop FF1 and a second flip-flop FF2 each having a data input terminal D to which a lower order address signal LADR from the address formatting part 15B-1 is inputted, and a third flip-flop FF3 and a fourth flip-flop FF4 each having a data input terminal D to which a write control signal WRSG from the memory control part 15B-2 is inputted. Moreover, there is provided a flip-flop FF0 for alternately outputting a first bank switching signal LD1 and a second bank switching signal LD2.

The first bank switching signal LD1 is a control signal for selecting the first bank BANK1, and is supplied to respective load terminals of the first and the third flip-flops FF1 and FF3. In addition, the second bank switching signal LD2 is a control signal for selecting the second bank BANK2, and is supplied to respective load terminals of the second and the fourth flip-flops FF2 and FF4. Each of these first to fourth flip-flops FF1–FF4 is a flip-flop having a load/hold function. Further, a clock CLK shown in FIG. 9A is supplied to each of clock terminals T of the flip-flops FF0–FF4 so that these flip-flops are controlled in synchronism with one another. One period T of this clock CLK corresponds to one operating period of the MUT 16 (one test period of the memory testing apparatus).

The flip-flop FF0 alternately generates, every time the clock CLK shown in FIG. 9A is applied thereto, the first bank switching signal LD1 (FIG. 9D) and the second bank switching signal LD2 (FIG. 9G) each having logical H (logical "1"). That is, the flip-flop FF0 outputs the second bank switching signal LD2 having logical L (logical "0") when the first bank switching signal LD1 is in logical H, and outputs the first bank switching signal LD1 having logical L when the second bank switching signal LD2 is in logical H. When the bank switching signal LD1 or LD2 having logical H is supplied to each of the load terminals LD of the respective flip-flops FF1 and FF3 or each of the load terminals LD of the respective flip-flops FF2 and FF4 and the clock CLK is supplied to each of clock input terminals T of those flip-flops, the lower order address signal LADR and the write control signal WRSG being applied to the data input terminals D at that time are loaded into the corresponding flip-flops at the rising edge of the clock CLK.

The lower order address signal LADR outputted from the address formatting part 15B-1 is, as shown in FIG. 9B, a signal having the same period as the operating period T of the MUT 16, and the lower order addresses are generated, in this example, in the sequence of #1→#0→#1→#0→ #0→ . . . The memory control part 15B-2 outputs, when the failure signal FAIL shown in FIG. 9C is inputted thereto, a write control signal WRSG having, in this example, its pulse duration (or width) of two times the operating period T when the lower order address signal is logical "1" as mentioned above. In the example shown in FIG. 9, the write control signal WRSG is in synchronous state with the failure signal FAIL shown in FIG. 9C. Since the first and the second bank switching signals LD1 and LD2 are alternately generated, each of these signals has a period of two times the operating period T, as shown in FIGS. 9D and 9G.

As can be easily understood from FIG. 9, when the first bank switching signal LD1 shown in FIG. 9D is logical H, the lower order address signal LADR shown in FIG. 9B supplied to the first flip-flop FF1 becomes #0, #0 and #1, and the write control signal WRSG supplied to the third flip-flop FF3 becomes logical L, logical H, and logical L. As a result, an address signal ADRI outputted from the first flip-flop FF1 becomes, as shown in FIG. 9E as BK1, #0, #0 and #1 each having a period of two times the operating period T, and is supplied to an address terminal Ad of the first bank BANK1. In addition, there is outputted from the third flip-flop FF3, as shown in FIG. 9F, a write command signal CS1 having its pulse duration of two times the operating period T and rising at the rising edge of the fourth clock CLK4 shown in FIG. 9A and falling at the rising edge of the sixth clock CLK6 shown in FIG. 9A. This write command signal CS1 is supplied to a write command input terminal CS of the first bank BANK1. Only during the time duration that the write command signal CS1 of logical H is applied to the write command input terminal CS of the first bank BANK1, the first bank BANK1 can write therein the logical "1" (corresponding to the generated failure signal FAIL) being applied to its data input terminal Di.

Similarly, when the second bank switching signal LD2 shown in FIG. 9G is logical H, the lower order address signal LADR shown in FIG. 9B supplied to the second flip-flop FF2 becomes #1, #1, #0 and #2, and the write control signal WRSG supplied to the fourth flip-flop FF4 becomes logical L, logical H, logical L and logical H. As a result, an address signal ADR2 outputted from the second flip-flop FF2 becomes, as shown in FIG. 9H as BK2, #1, #1 and #0 each having its period of two times the operating period T, and is supplied to an address terminal Ad of the second bank BANK2. In addition, there is outputted from the fourth flip-flop FF4, as shown in FIG. 9I, a write command signal CS2 having its pulse duration of two times the operating period T and rising at the rising edge of the third clock CLK3 shown in FIG. 9A and falling at the rising edge of the fifth clock CLK5 shown in FIG. 9A. The write command signal CS2 is supplied to a write command input terminal CS of the second bank BANK2. Only during the time duration that the write command signal CS2 of logical H is applied to the write command input terminal CS of the second bank BANK2, the second bank BANK2 can write therein the logical "1" (corresponding to the generated failure signal FAIL) being applied to its data input terminal Di.

As discussed above, since each of the first and the second flip-flops FF1 and FF2 holds the lower order address signal LADR which has been acquired therein at the rising edge of the clock CLK applied thereto when the load terminal LD thereof has been in logical H until the rising edge of the clock CLK applied to the flip-flop when the load terminal LD thereof is in logical H at the next time, the address signals ADR1 and ADR2 outputted respectively from these flip-flops FF1 and FF2 have, as shown in FIGS. 9E and 9H, their periods of two times the period of the lower order address signal LADR shown in FIG. 9B, respectively, and have their phases shifted by one operating period T of the MUT 16 from one another. Similarly, the write command signals CS1 and CS2 supplied to the write command nput terminals CS of the respective first and second banks BANK1 and BANK2 also have their pulse durations of two times the operating period T of the MUT 16, and have their phases shifted by one operating period T from one another. On the other hand, the first and the second banks BANK1 and BANK2 are alternately operated by the bank switching signals LD1 and LD2 with their phases shifted by one operating period T of the MUT 16 from each other. Accordingly, the memory part 15A operates with its period 2T (period shown in FIG. 9 as PFAM) which is twice the operating period T of the MUT 16. In other words, the memory part 15A operates at low rate or speed (at a rate of ½ of that of the MUT 16).

The first and the second banks BANK1 and BANK2 store, only during the time interval that the write command signals CS1 and CS2 are being applied to their write command input terminals CS, logical "1" being supplied to their data input terminals Di in the addresses specified by the address signals ADR1 and ADR2 supplied to their address terminals Ad at that time as a substitution for the generated failure signal FAIL, respectively. In the example shown in FIG. 9, since the second bank switching signal LD2 is in logical H when a failure signal FAIL is generated, a write command signal CS2 is generated at the rising edge of the third clock CLK3. As a result, a logical "1" is stored in the address #1 of the second bank BANK2.

In this manner, according to the aforementioned interleaved operation, even if failure signals are generated at high rate from a memory under test operating at high rate, these failure signals can be written in the failure analysis memory 15.

Incidentally, in order to store the failure signals in the failure analysis memory 15 by the aforementioned two-way interleaved operation, a memory having the same storage capacity as that of the MUT 16 must be prepared as each of the first and the second banks BANK1 and BANK2. Next, the reason thereof will be described.

The address sequence automatically generated within the MUT 16 includes an interleave sequence and a linear sequence. FIG. 10 shows a relationship between burst addresses generated in the both sequences in the case that the burst length is four. In FIG. 10, each of #0, #1, #2 and #3 represents a burst address, and each of $A_1$, $A_2$, $A_3$ and $A_4$ represents an address group in the interleave sequence.

For example, if it is assumed, in the linear sequence, that the first and the second banks BANK1 and BANK2 of the memory part 15A are accessed in the sequence of BANK1→BANK2→BANK1→BANK2, the internally generated address of the memory under test changes in the sequence of #0→#1→#2→#3 when the burst starting address is #0. The status of accessing to the memory part 15A of the failure analysis memory 15 in this case becomes the sequence of, as shown in FIG. 11A, BANK1 (#0) →BANK2 (#1)→BANK1 (#2)→BANK2 (#3).

Similarly, the internally generated address of the memory under test changes in the sequence of #1→#2→#3→#0 when the burst starting address is #1. The status of accessing to the memory part 15A in this case becomes the sequence of, as shown in FIG. 11B, BANK1 (#1)→BANK2 (#2) →BANK1 (#3)→BANK2 (#0).

It could be understood that in the both sequences, the same address is not accessed in succession. The pattern generator 12 has a function for generating this burst address in the similar manner to the case of generating the burst address within the memory under test. The pattern generator 12 outputs, separately from the address signal to be applied to the memory under test, an address signal containing this burst address to the failure analysis memory 15 so that failure signals generated in the case that the memory under test operates in the burst mode can also be stored in the failure analysis memory 15.

As is apparent from FIG. 10, assuming that at the starting point of the burst mode, the write operation is started without fail from, for example, the first bank BANK1, and the memory part 15A is accessed in the sequence of BANK1→BANK2→BANK1→BANK2, if the starting address of the burst mode changes in the sequence of #0→#1→#2→#3, all of these addresses #0–#3 must be provided in the first bank BANK1. Similarly, it is also necessary that all of the addresses #0–#3 are provided in the second bank BANK2.

Specifically, the address group $A_1$ in the interleave sequence shown in FIG. 10 accesses the bank BANK1, the address group $A_2$ accesses the bank BANK2, the address group $A_3$ accesses the bank BANK1, and the address group $A_4$ accesses the bank BANK2. In this manner, since all of the address groups $A_1$, $A_2$, $A_3$ and $A_4$ shown in FIG. 10 have the addresses #0–#3 provided therein respectively, it could be understood that the same number of addresses (storage capacity) as that of the memory under test must be provided in each of the banks.

As described above with reference to FIGS. 11A and 11B, the access status to the first and the second banks BANK1 and BANK2 of the memory part 15A in the interleaved operation becomes the sequence of, when the burst starting address is #0, BANK1 (#0)→BANK2 (#1)→BANK1 (#2) →BANK2 (#3), which results in that the addresses #1 and #3 in the first bank BANK1 are not accessed, and that the addresses #2 and #4 in the second bank BANK2 are not accessed. On the other hand, the access status to the first and the second banks BANK1 and BANK2 of the memory part 15A becomes the sequence of, when the burst starting address is #1, BANK1 (#1)→BANK2 (#2)→BANK1 (#3) →BANK2 (#0), which results in that the addresses #0 and #2 in the first bank BANK1 are not accessed, and the addresses #1 and #3 in the second bank BANK2 are not accessed.

What can be understood from FIG. 11 is that the amount of data to be actually written in each of the first and the second banks BANK1 and BANK2 is only ½ of the storage capacity of each bank. However, as mentioned above, since the burst starting address is not specified to each bank on entering into the burst mode, the addresses corresponding to all of the addresses of the memory under test must be provided in each of both the banks BANK1 and BANK2. Consequently, the storage capacity of each of the two banks BANK1 and BANK2 constituting the memory part 15A must be equal to the storage capacity of the memory under test, and hence there is a serious drawback in the conventional memory testing apparatus that the storage capacity of each bank of the memory part 15A cannot be reduced.

In the above discussion, the two-way interleaved operation has been explained. However, when the operating frequency of the memory under test MUT becomes high and the number of interleave ways is increased, the number of banks used in the memory part 15A of the failure analysis memory 15 is naturally increased as shown in FIG. 12. Therefore, when the storage capacity and the operating rate of the memory under test MUT are increased more and more, the number of memories used in the memory part 15A of the failure analysis memory 15 is further increased, resulting in a drawback that the storage capacity of the memory part 15A is massive, and the cost of the memory testing apparatus is increased as well as the physical size thereof becomes enormous.

SUMMARY OF THE INVENTION

It is an object of the present invention to provide a failure analysis memory in which the number of memories to be used therein is not increased even if the number of interleave ways is increased.

It is another object of the present invention to provide a semiconductor memory testing apparatus provided with a failure analysis memory that performs a multi-way interleaved operation and in which the storage capacity of the memory is decreased.

In order to achieve the above objects, in one aspect of the present invention, there is provided a failure analysis memory which is constructed such that a plurality of banks are operated in an interleaved operation and failure signals generated at high rate from a semiconductor memory under test are acquired into these banks, and comprises: bank control means for generating a bank switching signal by a lower order bit or bits of an address signal; bank selecting means for selecting either one of the plurality of banks to be operated in the interleaved operation by the bank switching signal outputted from the bank control means; and access means for accessing an address of a memory constituting the selected bank by an address signal composed of the remaining higher order bit or bits of the address signal.

In a preferred embodiment, the aforesaid failure analysis memory further includes: means for supplying a write command signal to the bank selected by the bank switching signal in the case that a failure signal is generated from the semiconductor memory under test.

In addition, the failure analysis memory further includes: lower order address selecting means for selecting and extracting at least the least significant bit of the address signal, and the bank control means outputs the bank switching signal in correspondence to a logical signal outputted from the lower order address selecting means.

Moreover, the aforesaid bank selecting means is a plurality of flip-flops each having a load/hold function, and the lower order bit or bits of the address signal are loaded onto one of the flip-flops selected by the bank switching signal outputted from the bank control means, thereby to select one bank.

Furthermore, the access means is a plurality of flip-flops each having a load/hold function, and an address signal composed of a higher order bit or bits of the address signal is loaded onto one of the flip-flops selected by the lower order bit or bits of the address signal, thereby to access a memory constituting one bank.

In another aspect of the present invention, there is provided a semiconductor memory testing apparatus provided with a failure analysis memory which is constructed such that a plurality of banks are operated in an interleaved operation and failure signals generated at high rate from a semiconductor memory under test are acquired into these banks, and the failure analysis memory comprises: bank control means for generating a bank switching signal by a lower order bit or bits of an address signal; bank selecting means for selecting either one of the plurality of banks to be operated in the interleaved operation by the bank switching signal outputted from the bank control means; and access means for accessing an address of a memory constituting the selected bank by an address signal composed of the remaining higher order bit or bits of the address signal.

With the construction of the present invention, it is sufficient that the memory part of the failure analysis memory may have its total storage capacity equal to the storage capacity of the memory under test without respect to the number of interleave ways. Therefore, there is obtained an advantage that the number of memories to be used in the failure analysis memory can be remarkably reduced.

BRIEF DESCRIPTION OF THE DRAWINGS

FIG. 3 shows a truth value table of bank switching signals outputted from the bank control part of the failure analysis memory shown in FIG. 1;

FIGS. 4A–4B are diagrams for explaining a status in which banks of the memory part of the failure analysis memory shown in FIG. 1 are accessed in an interleave operation;

FIG. 5 is a diagram for explaining an address signal to be supplied to the memory part of the failure analysis memory shown in FIG. 1;

FIG. 6 is a block diagram showing a basic configuration of an example of a conventional memory testing apparatus;

FIG. 10 is a diagram for explaining a generation state of burst addresses internally generated in a memory operating at high speed;

FIGS. 11A–11B are diagrams for explaining a status in which banks of the memory part of the failure analysis memory shown in FIG. 8 are accessed in an interleave operation; and FIG. 12 is a diagram showing a relationship between the nunber of ways of the interleave operation and the number of banks used in the memory part of the failure analysis memory that performs an interleave operation.

DETAILED DESCRIPTION OF THE PREFERRED EMBODIMENTS

Figure 1:
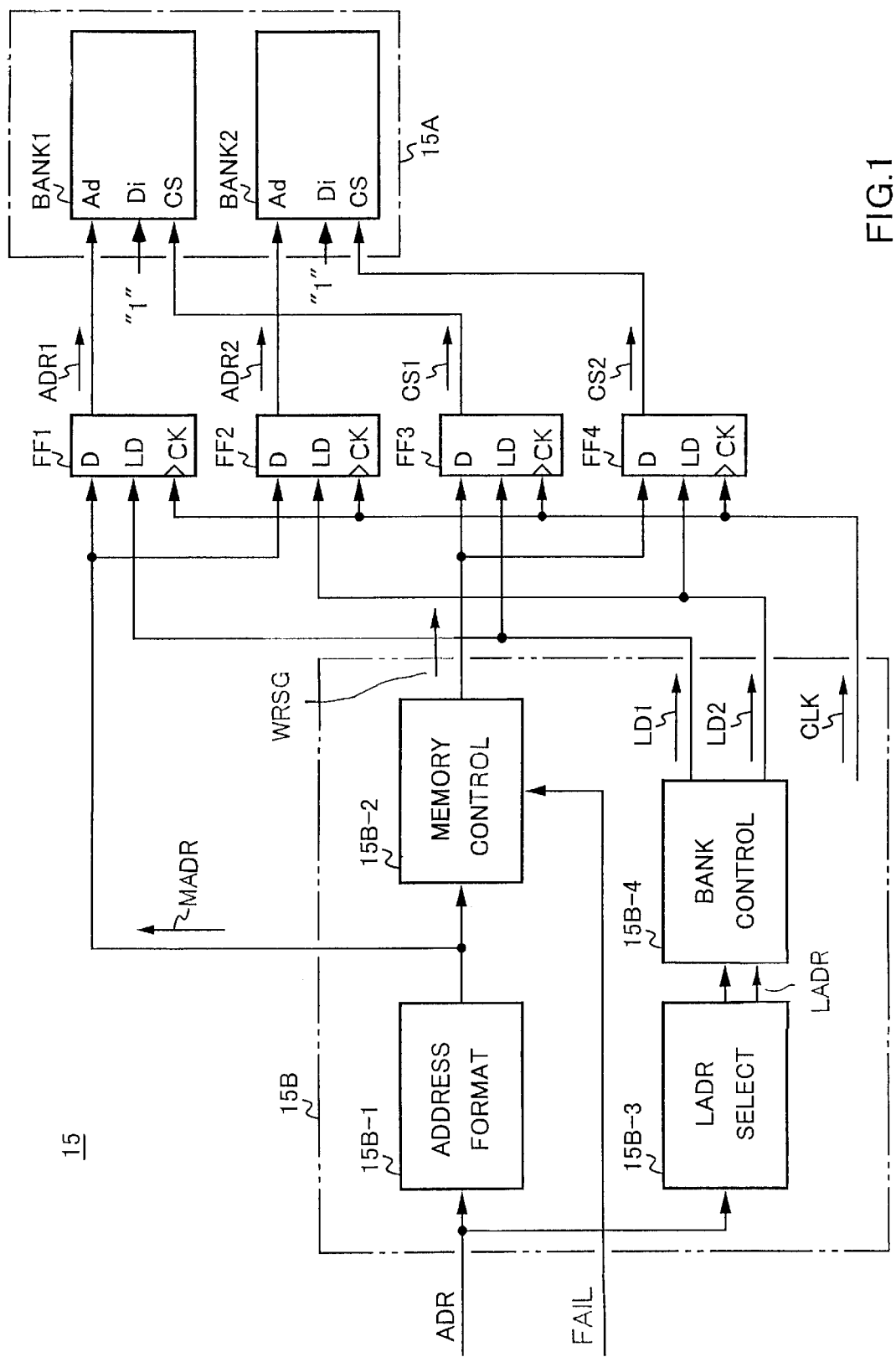
FIG. 1 is a block diagram showing a schematic configuration of a failure analysis memory used in an embodiment of a semiconductor memory testing apparatus according to the present invention.

Now the present invention will be described in regard to the preferred embodiments thereof in detail with reference to FIGS. 1 to 5. Further, portions (data, waveforms, circuits, etc.) in these figures corresponding to those in FIGS. 6 to 12 will be shown by the same reference characters affixed thereto, and the explanation thereof will be omitted unless it is necessary.

FIG. 1 is a block diagram showing, in outlilne, a configuration of the failure analysis memory used in an embodiment of the semiconductor memory testing apparatus according to the present invention, and shows a case in which the present invention is applied to a failure analysis memory 15 that performs the two-way interleaved operation. The construction characterized by the present invention is that there are provided in a control part 15B of the failure analysis memory 15 a lower order address selecting part 15B-3 and a bank control part. 15B-4 for generating bank switching signals LD1 and LD2 in accordance with a lower order address selected by the lower order address selecting part 15B-3, and that the flip-flop FF0 shown in FIG. 8 for alternately generating the bank switching signals LD1 and LD2 is omitted.

An address signal ADR is inputted to the lower order address selecting part 15B-3 from a pattern generator 12 (refer to FIG. 5). Since the failure analysis memory 15 operates in the two-way interleaved operation, the memory part 15A thereof is constituted by a fist and a second two banks BANK1 and BANK2. Therefore, it is sufficient that the lower order address selecting part 15B-3 selects and extracts only the least significant bit out of the address signal ADR supplied thereto from the pattern generator 12. The extracted least significant bit (hereinafter referred to as lower order address LADR) is supplied to the bank control part 15B-4.

A truth table of the bank control part 15B-4 is shown in FIG. 3. When the lower order address LADR in the address signal ADR is "0", the bank control part 15B-4 outputs "1" as the first bank switching signal LD1, and outputs "0" as the second bank switching signal LD2. When the lower order address LADR is "1", the bank control part 15B-4 outputs "0" as the first bank switching signal LD1, and outputs "1" as the second bank switching signal LD2.

If the first and the second bank switching signals LD1 and LD2 are defined in correspondence to a value of the lower order address LADR as mentioned above, arrangements of addresses in the first and the second banks BANK1 and BANK2 of the memory part 15A are determined as a matter of course, respectively. In this example, when the lower order address LADR is "0", the first bank BANK1 is selected, and when the lower order address LADR is "1", the second bank BANK2 is selected. As a result, even addresses are assigned to the first bank BANK1, and odd addresses are assigned to the second bank BANK2.

Figure 2:
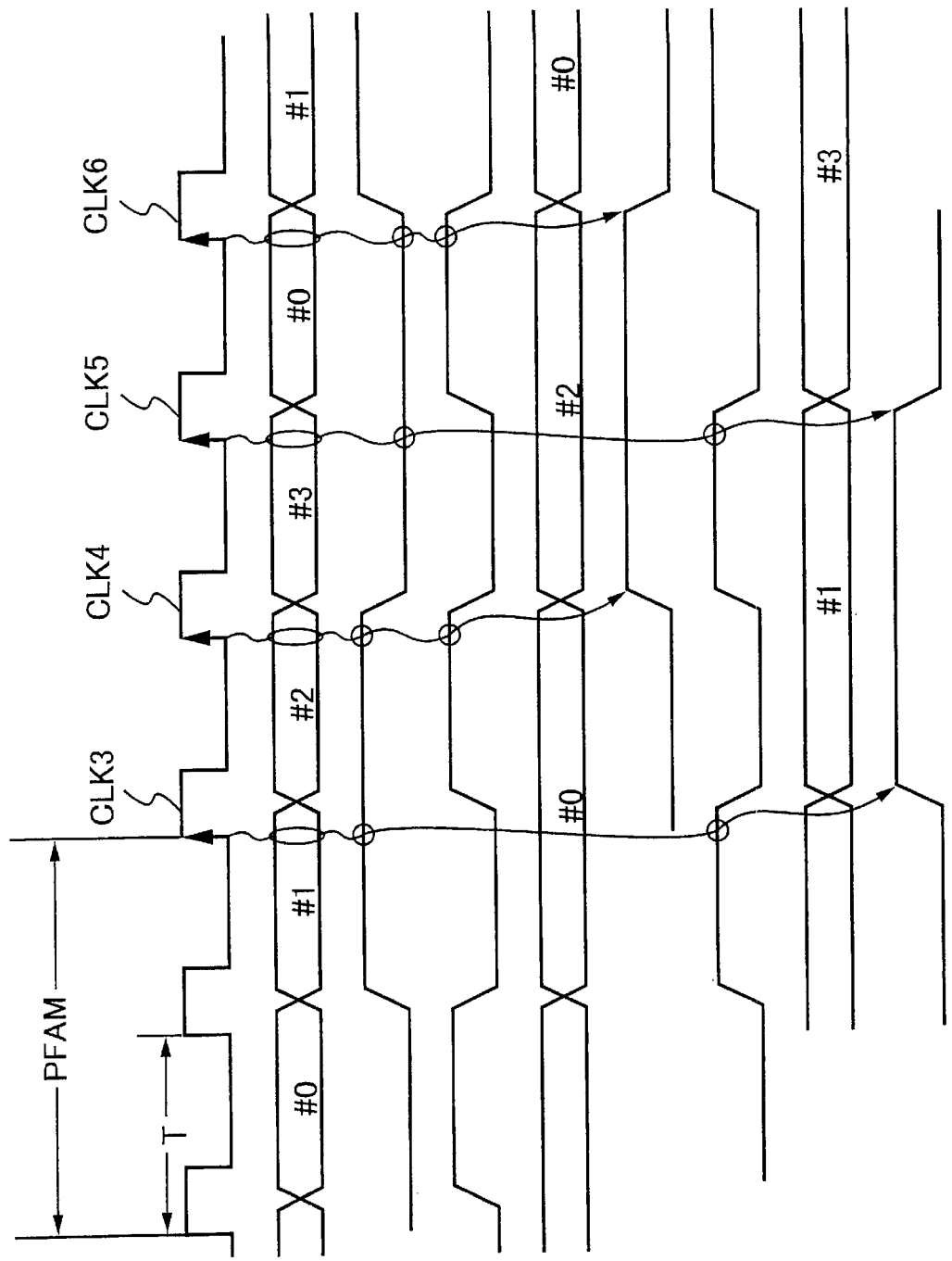
FIGS. 2A–2I are timing charts for explaining the operation of the failure analysis memory shown in FIG. 1.
Figure 7:
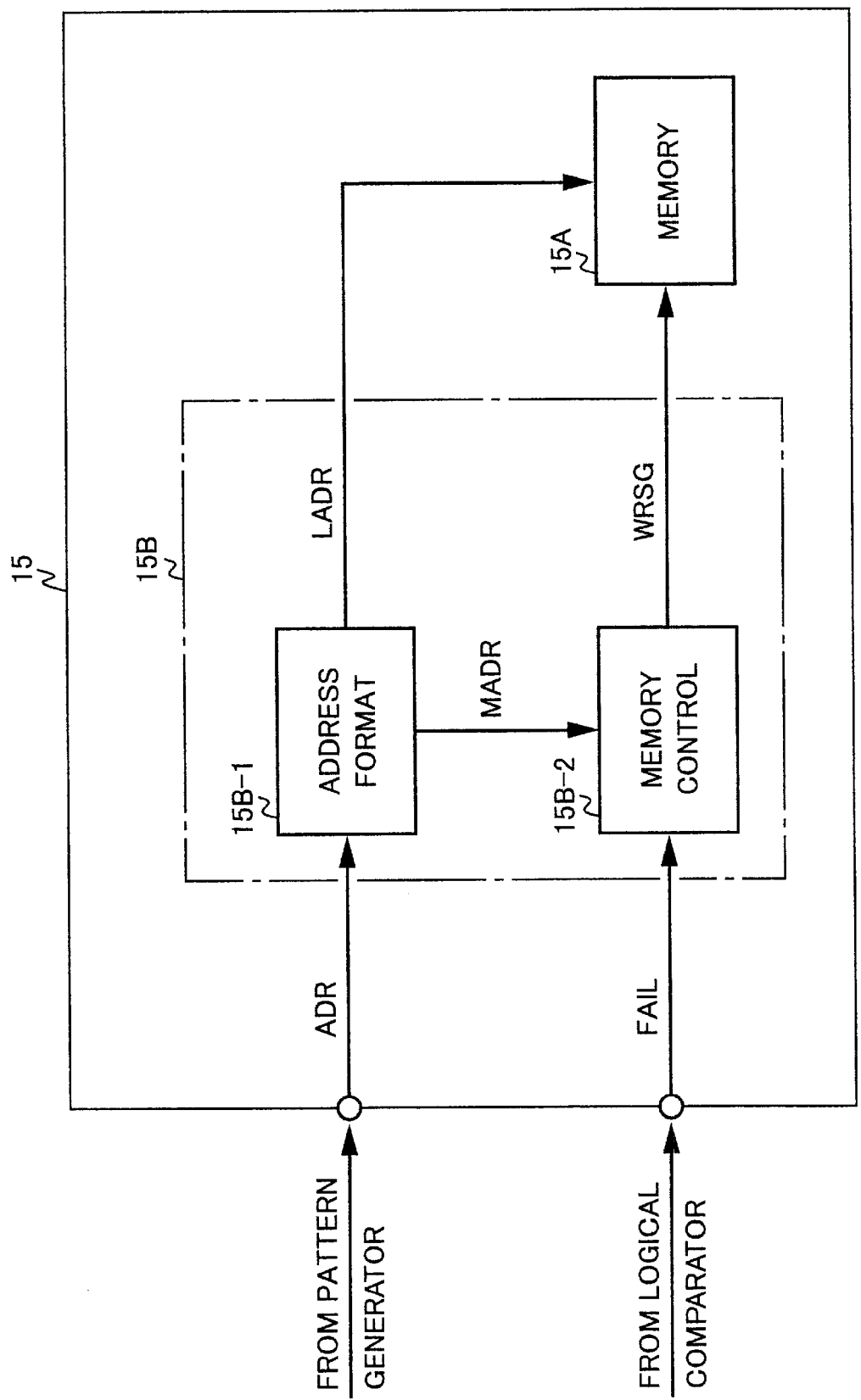
FIG. 7 is a block diagram showing a schematic configuration of a failure analysis memory used in the semiconductor memory testing apparatus shown in FIG. 6.
Figure 8:
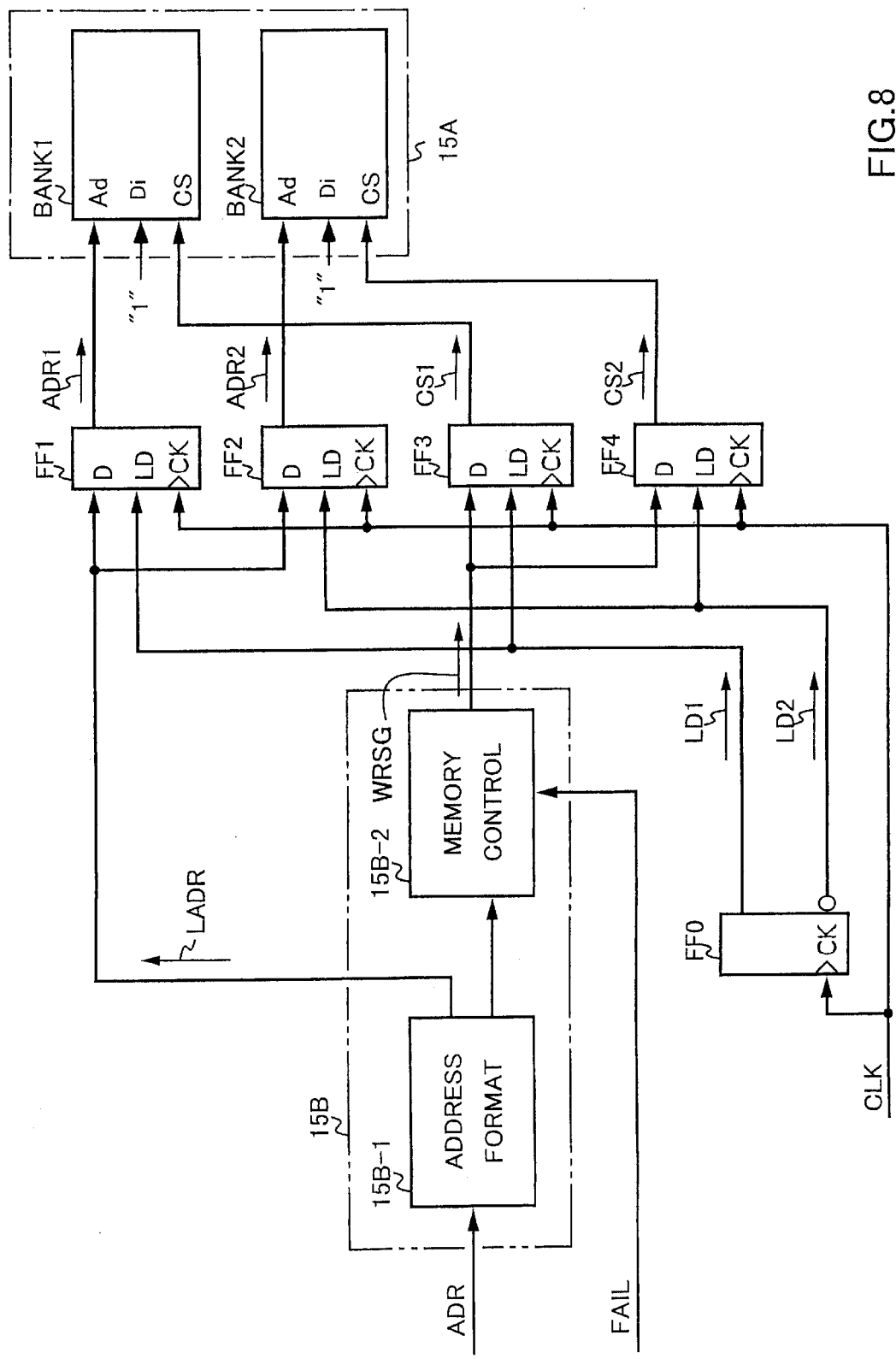
FIG. 8 is a block diagram showing a schematic configuration of an example of the conventional failure analysis memory that performs an interleave operation.
Figure 9:
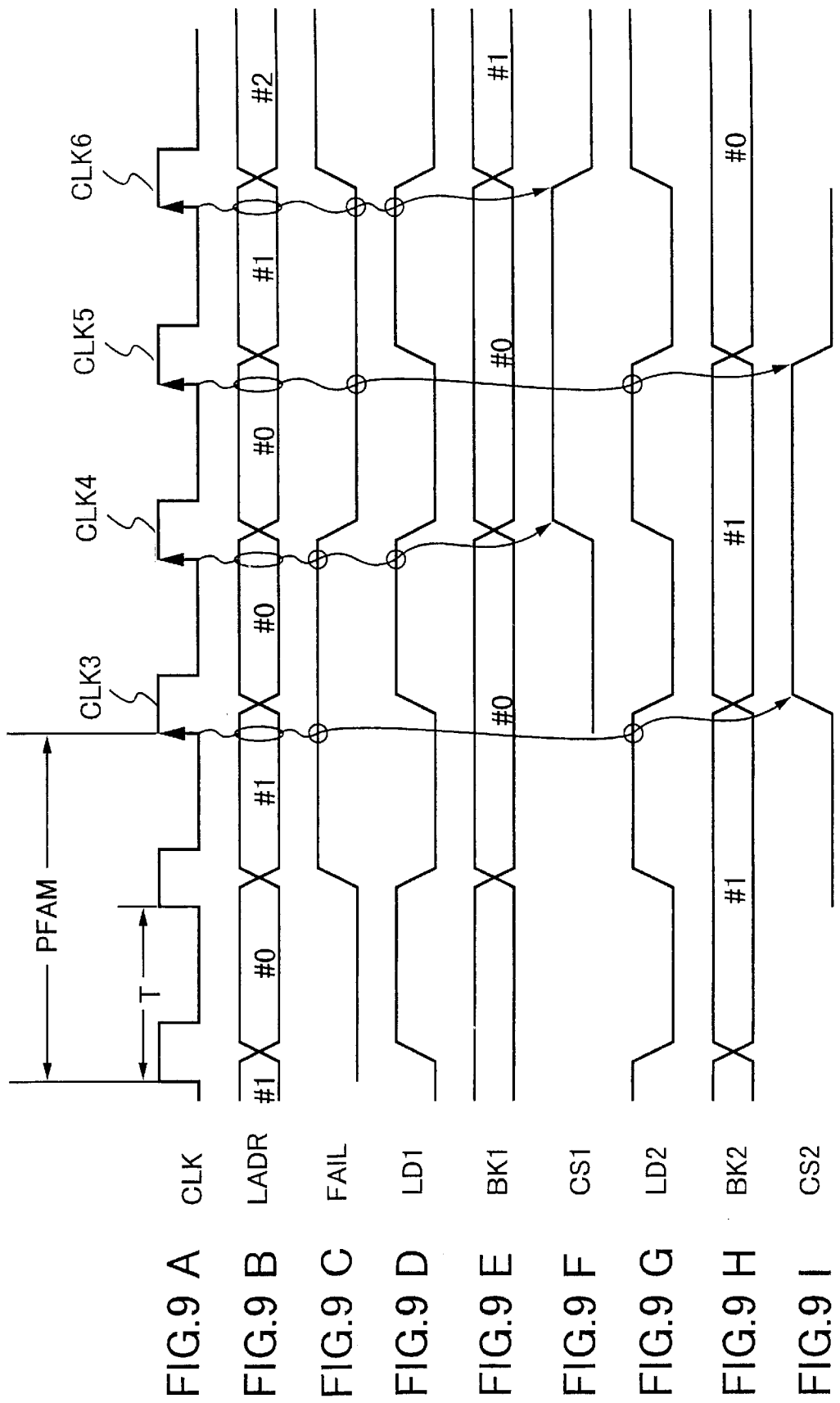
FIGS. 9A–9I are time charts for explaining the operation of the failure analysis memory shown in FIG. 8.

FIG. 2 is a timing chart for explaining the operation of the failure analysis memory 15 shown in FIG. 1. Since the circuit configuration of the failure analysis memory 15 except the lower order address selecting part 15B-3 and the bank control part 15B-4 is substantially the same as that of the conventional failure analysis memory shown in FIG. 8, the waveforms and data shown in FIG. 2 are substantially the same as those in FIG. 9 except that the first and the second bank switching signals LD1 and LD2 are outputted from the bank control part 15B-4. Accordingly, the explanation of those waveforms and data will be omitted.

In the case that the memory under test MUT operates in the normal operation mode, the memory under test operates at low rate. As a result, even if the same address of the memory under test is accessed in succession, and also in the memory part 15A of the failure analysis memory 15, the same bank, for example, the first bank BANK1 is continuously accessed over a plurality of operating periods, the write operation of failure signals (data) therein can be done. In other words, in the normal operation mode, the addresses of the memory under test are accessed at random, but in the failure analysis memory 15 one of the banks of the memory part 15A is specified in accordance with a value of the least significant bit of the address signal supplied thereto, and the write operation of logical "1" representing a failure signal FAIL is carried out.

In the case of the burst mode, the read-out rate or speed is increased. However, as for addresses generated within the memory under test, the same address is not generated in succession, as already discussed with reference to FIG. 10, in either of the interleave sequence and the linear sequence, that is, there is a rule that the same address is not accessed in succession, and accordingly, when the operation mode of the memory under test is switched to the high-rate operation mode, the lower order addresses LADR (burst addresses #0-#1-#2-#3) shown in FIG. 2B are alternately distributed to the first bank BANK1 and the second bank BANK2 by the interleaved operation as shown in FIGS. 2E and 2H. Therefore, when the address signals ADR1 (BK1) and ADR2 (BK2) each having a period of two times the operating period T of the memory under test are supplied to the address terminals Ad of the first and the second banks, respectively, and the failure signal FAIL shown in FIG. 2C is supplied to the memory control part 15B-2, the write control signal WRSG is generated so that the write command signals CS1 and CS2 each having a pulse duration of two times the operating period T of the memory under test are supplied to the write command input terminals of the first and the second banks, respectively. As a result, the memory part 15A of the failure analysis memory 15 can surely acquire, even if a failure signal is generated at each of the addresses, all of these failure signals (logical "1s"). Moreover, in the present invention, the two banks BANK1 and BANK2 of the memory part 15A that performs the interleaved operation are arranged such that even addresses are disposed in the first bank BANK1 and odd addresses are disposed in the second bank BANK2. Accordingly, if the total storage capacity of both the banks BANK1 and BANK2 is equal to the storage capacity of the memory under test, the failure signals generated at all of the addresses of the memory under test can be stored in the memory part.

The respective access statuses to the two banks BANK1 and BANK2 of the memory part 15A will be now described with reference to FIG. 4.

FIG. 4A shows an access status in the case that the burst address changes in the sequence of #0→#1→#2→#3. In this case, since the burst starting address is #0, the first bank BANK1 is selected at the first time as is apparent from the truth table shown in FIG. 3, and the address #0 prepared in the first bank BANK1 is accessed. At the second time, the burst address is #1, and in this case, the address #1 prepared in the second bank BANK2 is accessed. At the third time, the address #2 prepared in the first bank BANK1 is accessed, and at the fourth time, the address #3 prepared in the second bank BANK2 is accessed. Therefore, both of the two banks have no address that is not accessed.

FIG. 4B shows an access status in the case that the burst address changes in the sequence of #1→#2→#3→#0. In this case, since the burst starting address is #1, the second bank BANK2 is selected at the first time, and the address #1 prepared in the second bank BANK2 is accessed. At the second time, the address #2 prepared in the first bank BANK1 is accessed. At the third time, the address #3 prepared in the second bank BANK2 is accessed, and at the fourth time, the address #0 prepared in the first bank BANK1 is accessed. Therefore, in this case, too, both of the two banks have no address that is not accessed.

In the above description, the explanation was given assuming that even addresses #0, #2, #4, . . . have been prepared in the first bank BANK1, and odd addresses #1, #3, #5, . . . have been prepared in the second bank BANK2. A materialized method of preparing even addresses in one bank and odd addresses in the other bank as is mentioned above will be described with reference to FIG. 5.

Assuming that an address signal outputted from the pattern generator 12 is an address signal having, for example, six bits of B1 to B6 as shown in FIG. 5, a higher order address signal constituted by higher order five bits B2 to B6 obtained by removing the least significant bit B1 out of this address signal is supplied, in accordance with the value of the least significant bit B1 of this address signal, to corresponding one of the first flip-flop FF1 or the second flip-flop FF2 from, for example, the address formatting part 15B-1, and is latched therein. In addition, if a memory (RAM) constituting the first bank BANK1 or a memory constituting the second bank BANK2 of the memory part 15A is accessed by the latched five bit address signal, one bank and addresses to be arranged in that bank are determined. For example, if the five bit higher order address signal is latched in the flip-flop FF1 when the least significant bit B1 is "0" and latched in the flip-flop FF2 when the least significant bit B1 is "1", the addresses #0, #2, #4, #6, . . . are arranged in the first bank BANK1, and the addresses #1, #3, #5, #7, . . . are arranged in the second bank BANK2 as is apparent from FIG. 5.

Moreover, when a failure signal FAIL is generated, a write ommand signal CS1 or CS2 of logical "1" is supplied to the bank of the memory part 15A selected by the bank switching signal LD1 or LD2, and hence the write operation of a logical "1" representing the failure signal is performed. As can be also understood from FIG. 5, an address space of each of the memories constituting the first and the second banks BANK1 and BANK2 respectively may have a memory capacity corresponding to the bit width less by one bit than that of the address signal to be supplied to the memory under test.

Further, in the aforementioned embodiment, there has been described the case in which the present invention has been applied to the failure analysis memory that performs the two-way interleaved operation. However, the present invention is not limited to be applied to the failure analysis memory that performs the two-way interleaved operation, and can be also applied to a failure analysis memory that performs a multi-way interleaved operation such as three-way, four-way and the like. In the case of applying the present invention to a failure analysis memory that performs a three-way interleaved operation or a four-way interleaved operation, it is sufficient that the bank switching signal may be generated using the least significant two bits of an address signal. In the case that the present invention is applied to a failure analysis memory that performs the four-way interleaved operation, the memory part 15A is constituted by four banks, and it is sufficient that a memory constituting each of the four banks may have its memory capacity of ¼ of that of a memory under test.

As is apparent from the foregoing description, according to the present invention, in a failure analysis memory which is so as to acquire therein failure signals (data) generated at high rate by its interleaved operation, it is enough that the storage capacity of a memory part constituting the failure analysis memory is equal to the storage capacity of a semiconductor memory under test. Therefore, the storage capacity of each of a plurality of banks constituting the memory part can be reduced to a value obtained by dividing one (1) by the number of interleave ways (1/the number of ways). Particularly, in the case that the operating rate of the memory under test is high and the number of interleave ways must be increased accordingly, for example, in the case that a multi-way interleaved operation such as a four-way interleaved operation, an eight-way interleaved operation or the like is employed, there can be obtained a remarkable advantage that the storage capacity of the memory part of the failure analysis memory can be reduced to ¼ to ⅛ by applying the present invention thereto. As a result, there can be obtained effects that the semiconductor memory testing apparatus is prevented from becoming large in its physical size, and that the cost of the semiconductor memory testing apparatus can significantly be reduced.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the illustrated embodiment, and is intended to encompass all such modifications, alterations, changes, and/or minor improvements falling within the scope of the invention defined by the appended claims.

What is claimed is:

1. A failure analysis memory constructed such that a plurality of banks are operated in an interleaved operation and failure signals generated at high rate from a semiconductor memory under test are acquired into these banks, said failure analysis memory comprising:

bank control means for generating a bank switching signal obtained by extracting a lower order bit or bits of an address signal;

bank selecting means for selecting either one of said plurality of banks to be operated in the interleaved operation by the bank switching signal outputted from said bank control means; and access means for accessing an address of a memory constituting the selected bank by a higher-order address signal composed of the remaining higher order bit or bits of the address signal.

2. The failure analysis memory according to claim 1, further including: means for supplying a write command signal to the bank selected by the bank switching signal in the case that a failure signal is generated from the semiconductor memory under test.

3. The failure analysis memory according to claim 1, further including: lower order address selecting means for selecting and extracting at least the least significant bit of the address signal, and wherein said bank control means outputs the bank switching signal in correspondence to a logical signal outputted from said lower order address selecting means.

4. The failure analysis memory according to claim 1, wherein said bank selecting means is a plurality of flip-flops each having a load/hold function, and wherein the lower order bit or bits of the address signal are loaded onto one of the flip-flops selected by the bank switching signal outputted from said bank control means, thereby to select one bank.

5. The failure analysis memory according to claim 1, wherein said access means is a plurality of flip-flops each having a load/hold function, and wherein a higher-order address signal composed of a higher order bit or bits of the address signal is loaded onto one of the flip-flops selected by the lower order bit or bits of the address signal, thereby to access a memory constituting one bank.

6. The failure analysis memory according to claim 4, wherein said access means is said plurality of flip-flops each having a load/hold function and used as said bank selecting means, and wherein a higher-order address signal composed of a higher order bit or bits of the address signal is loaded onto one of the flip-flops selected by the lower order bit or bits of the address signal, thereby to access a memory constituting one bank.

7. A semiconductor memory testing apparatus provided with a failure analysis memory constructed such that a plurality of banks are operated in an interleaved operation and failure signals generated at high rate from a semiconductor memory under test are acquired into these banks, said failure analysis memory comprising:
   bank control means for generating a bank switchin signal obtained by extracting a lower order bit or bits of an address signal;
   bank selecting means for selecting either one of said plurality of banks to be operated in the interleaved operation by the bank switching signal outputted from said bank control means; and
   access means for accessing an address of a memory constituting the selected bank by a higher-order address signal composed of the remaining higher order bit or bits of the address signal.

8. A failure analysis memory capable of storing failure signals of a semiconductor memory which is tested under a burst mode at a high rate comprising:
   a plurality of banks operable in an interleaved operation so that the failure signals generated in time sequential order at the high rate from the semiconductor memory under test are interleaved and acquired into these banks at a reduced rate;
   a bank controller receiving an address signal to be applied to the memory under test for extracting a lower order bit or bits and for generating bank switching signals in correspondence to the lower order bit or bits of the address signal, the addresses of said lower order bit or bits correspondingly designating the respective one of the banks to be accessed;
   memory control means responsive to the failure signals of the semiconductor memory under test for generating a write control signal,
   bank selecting means responsive to the write control signal and the bank switching signal for generating write command signals to select one of said plurality of banks to be operated in the interleaved operation; and
   access means responsive to a higher order address signal which is obtained by removing the lower order bit or bits out of the address signal and the bank switching signal for accessing to a memory constituting the selected one of the banks selected by the write command signal at an address designated by the higher order address signal
   whereby memory capacity of each bank can be reduced to 1/N of that of the memory under test where N is the number of the banks used.

9. The failure analysis memory according to claim 8, wherein said bank controller comprises:
   lower order address selecting means for selecting and extracting the least significant bit or bits of the address signal, and
   bank control means receiving the least significant bit or bits thus extracted by the lower order address selecting means for generating the bank switching signal in correspondence to a logical signal outputted from said lower order address selecting means.

10. The failure analysis memory according to claim 8, wherein said bank selecting means is a plurality of flip-flops each having a load/hold function, and wherein the write control signal is loaded onto one of the flip-flops selected by the bank switching signal outputted from said bank controller, thereby to select one bank.

11. The failure analysis memory according to claim 8, wherein said access means is a plurality of flip-flops each having a load/hold function, and wherein the higher order address signal is loaded onto one of the flip-flops selected by the bank switching signal, thereby to access a memory constituting the one bank corresponding to the selected one flip-flop.

12. A semiconductor memory testing apparatus comprises:
   a timing generator;
   a pattern generator;
   a waveform formatter;
   a logical comparator; and
   a failure analysis memory according to claim 8, wherein said failure analysis memory is constructed such that a plurality of banks are operated in an interleaved operation and failure signals generated at high rate from a semiconductor memory under test are acquired into these banks,
   whereby memory capacity of each bank can be reduced to 1/N of that of the memory under test where N is the number of the banks used.

* * * * *